United States Patent [19]

Watanabe et al.

[11] Patent Number: 4,886,573
[45] Date of Patent: Dec. 12, 1989

[54] PROCESS FOR FORMING WIRING ON SUBSTRATE

[75] Inventors: Hiroshi Watanabe, Mito; Osamu Miura, Hitachi; Kunio Miyazaki, Hitachi; Shunichi Numata, Hitachi; Kanji Otsuka, Higashiyamato, all of Japan

[73] Assignee: Hitachi, Ltd., Tokyo, Japan

[21] Appl. No.: 87,021

[22] Filed: Aug. 19, 1987

[30] Foreign Application Priority Data

Aug. 27, 1986 [JP] Japan ................. 61-200971

[51] Int. Cl.$^4$ ........................................... H01L 21/28
[52] U.S. Cl. .............................. 156/643; 156/659.1;
156/661.1; 156/668; 437/203; 437/944
[58] Field of Search .................. 156/643, 659.1, 661.1,
156/668; 437/187, 203, 228, 235, 944;
148/DIG. 100; 528/353

[56] References Cited

U.S. PATENT DOCUMENTS

| | | | |
|---|---|---|---|
| 3,179,633 | 4/1965 | Endrey | 528/353 X |
| 4,218,283 | 8/1980 | Saiki et al. | 156/656 |
| 4,367,119 | 1/1983 | Logan et al. | 156/643 |
| 4,428,796 | 1/1984 | Milgram | 156/668 X |
| 4,451,971 | 6/1984 | Milgram | 437/198 |
| 4,497,684 | 2/1985 | Sebesta | 156/643 |
| 4,519,872 | 5/1985 | Anderson et al. | 156/643 |
| 4,606,998 | 8/1986 | Clodgo et al. | 156/659.1 X |

FOREIGN PATENT DOCUMENTS

| | | |
|---|---|---|
| 0019391 | 11/1980 | European Pat. Off. . |
| 0133533 | 2/1985 | European Pat. Off. . |
| 2392495 | 12/1978 | France . |
| 54-138068 | 10/1979 | Japan ........ 528/353 |
| 60-157286 | 8/1985 | Japan ........ 528/353 |
| 1230421 | 5/1971 | United Kingdom . |

OTHER PUBLICATIONS

Milgram, "Lift-Off Process for Achieving Fine-Line Metallization", J. Vac. Sci. Technol. B, vol. 1, No. 2, Apr.–Jun. 1983, pp. 490–493.

Frary et al., "Lift-Off Techniques for Fine Line Metal Patterning", Semiconductor International, Dec. 1981, pp. 72–89.

*Primary Examiner*—David L. Lacey
*Assistant Examiner*—Andrew J. Anderson
*Attorney, Agent, or Firm*—Antonelli, Terry & Wands

[57] ABSTRACT

In a process for forming a wiring conductor of Cu, Al, Au or the like on a wiring substrate, polyimide-based resin having the following unit structural formula is used as a lift-off material.

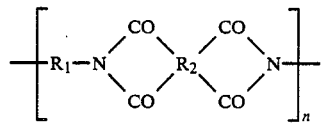

wherein $R_1$:

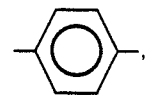

$R_2$:

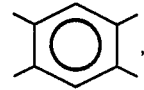

n is an integer of 15,000 to 30,000. This lift-off material has very good etching susceptibility and can be selectively lifted off with an etching solution of a mixture of hydrazine and ethylene diamine from a lower polyimide layer having $R_1$:

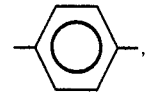

and $R_2$:

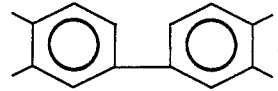

11 Claims, 4 Drawing Sheets

FIG. I(A)
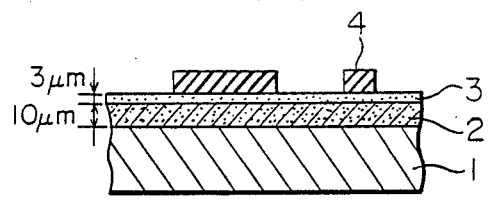
FIG. I(B)
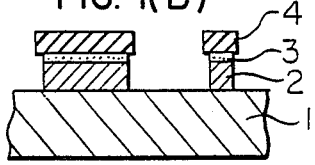
FIG. I(C)
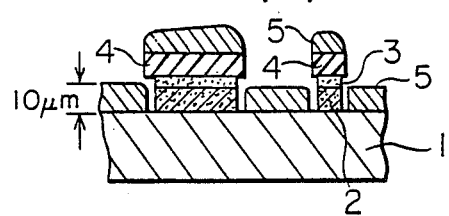
FIG. I(D)
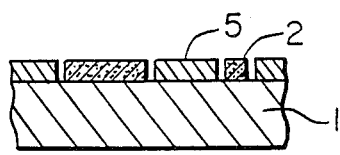
FIG. I(E)
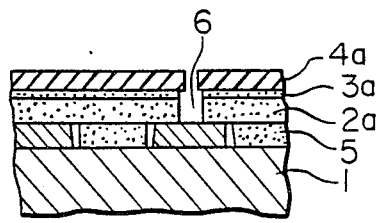
FIG. I(F)
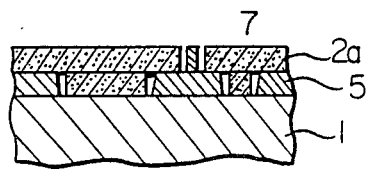
FIG. I(G)
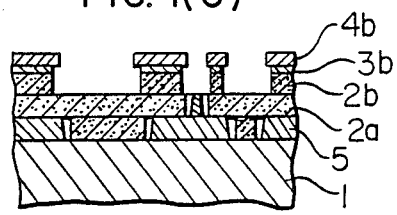

PROCESS FOR FORMING WIRING ON SUBSTRATE

BACKGROUND OF THE INVENTION

1. Field of the Invention

This invention relates to a process for forming a wiring on a substrate, and more particularly to a process for forming a wiring on a substrate according to a lift-off technique.

2. Description of the Prior Art

A known process for forming a wiring on a substrate according to the lift-off technique comprises forming a wiring pattern with a lift-off material, then forming a wiring conductor of Al, Cu, Au, or the like on the wiring pattern parts and on the lift-off material by vapor deposition, sputtering, etc., and removing the conductor on parts other than the wiring parts together with the lift-off material, thereby obtaining a wiring of desired pattern. Examples of processes for forming wiring according to the lift-off technique are shown in "Semiconductor International", December, 1981, pages 72–89 and J. Vac. Sci. Technol. B, Vol 1, No. 2, April-June, 1983, pages 490–493. In the process according to the lift-off technique, the lift-off material usually has a reversed tapered form so that a wiring conductor may not be connected to unwanted conductors. Furthermore, the lift-off material must have a good heat resistance because vapor deposition and sputtering of the wiring conductor such as Cu, Al or Au is usually carried out at a high temperature, for example, 200-350° C. to improve the adhesion to a substrate. Still furthermore, the lift-off material must not release a gas, etc. for example, also must be readily removable by lifting off.

Usually, polyimide-based resin is used as the lift-off material, and also photoresists are used frequently. However, these lift-off materials have the following disadvantages.

In the case of a photoresist as the lift-off material, the wiring conductor must be vapor deposited at room temperature or below the room temperature because the photoresist has a very low heat resistance, and also it is hard to form a wiring conductor with good adhesion to a substrate. When the wiring conductor is vapor deposited at 100° C. or higher, the photoresist is deteriorated by the heat and cannot be lifted off even by using an etching solution.

In the case of polyimide-based resin as the lift-off material, there are no problems at all, as long as the lift-off material and the wiring conductor each have a thickness of about 1 μm, whereas there appears a "head-to-lift off" problem, if the thickness is in a range of 10 to 20 μm. Specifically, the polyimide-based, resin is usually lifted off either by $O_2$ plasma asher or by a etching solution.

Lifting off of the polyimide-based resin by $O_2$ plasma asher takes a long time with a poor working efficiency, and also it is hard to remove the resin film completely, that is, there remain the resin residues.

Lifting off of the polyimide-based resin by an etching solution has the problem that, when a wiring conductor has a large thickness or when a polyimide-based resin film, that is, the lift-off material, must have a large thickness, it is hard to dissolve the lift-off material, and therefore, it is hard to remove the lift-off material. To solve the problem, the lift-off material must be dipped in the etching solution for a few hours. When a wiring of Al or Cu is dipped in the etching solution for a long time, the wiring part is peeled off.

A wiring conductor having a large thickness, for example, 10–20 μm, is now in a keen demand in a module substrate for mounting a large-scale integration (LSI), and it is necessary to develop a process for readily forming a wiring having such a thickness as above according to the lift-off technique. Prior art on the lift-off technique includes Japanese Patent Applications Kokai (Laid-open) Nos. 54-87525 and 52-156583, where the former discloses a double layer structure of a photoresist and the latter discloses use of polyimide-based resin as a lift-off material.

SUMMARY OF THE INVENTION

An object of the present invention is to solve the foregoing problems and specifically provide a process for easily and surely forming a wiring, even a multiple layer module wiring, whose wiring conductor and lift-off material of polyimide-based resin each are as thick as 10–20 μm.

Another object of the present invention is to provide a process for forming a multiple layer wiring, where wiring having a thickness of 10–20 μm is formed in at least two layers.

STATEMENT OF THE INVENTION

According to the present invention, a wiring is formed according to the lift-off technique using polyimide-based resin having the following unit structural formula Y as a lift-off material. That is, as a result of extensive studies of etching susceptibilities of various polyimide-based resins as heat-resistant lift-off materials that can withstand a temperature of 200 to 350° C. at which a wiring conductor is vapor deposited or sputtered, the present inventors have found that the resin having the following unit structural formula Y has a considerably high etching rate:

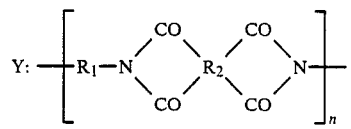

where $R_1$:

$R_2$:

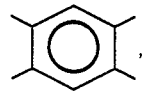

and n is an integer of 15,000 to 30,000.

The resin having the above unit structural formula Y is superior to the ordinary polyimide-based resin also in heat resistance and has no fear of releasing a gas during the vapor deposition. In other words, it has been found that the lifting off can be readily carried out when the polyimide-based resin having the above unit structural formula Y is used as a lift-off material.

The present process for forming a wiring is carried out, for example, according to the following steps (a) to (e).

Step (a): Polyimide-based resin having said unit structural formula Y is formed as a lift-off material on the surface of a wiring substrate, for example, silicon wafer, by coating. There may be an oxide surface film ($SiO_2$ film) on the surface of silicon wafer, but the lift-off material can be formed even on such a wafer surface. In the case of module substrates, for example, for mounting LSI, wiring is often formed on an alumina substrate or a silicon nitride substrate. The lift-off material can be also applied to such a substrate.

Step (b): A mask for etching the lift-off material is formed in a desired wiring pattern on the surface of the lift-off material.

When a wiring pattern is formed by dry etching the lift-off material, it is preferable to use $SiO_2$, or the like, as a mask for dry etching and coat the surface of the lift-off material with the mask to a thickness of about 1 μm by sputtering, for example. Then, the mask for dry etching is patterned in a desired wiring pattern by a photoresist as a mask.

When the lift-off material is patterned by an etching solution, a photoresist mask may be directly formed on the surface of the lift-off material.

Step (c): The lift-off material is patterned with the mask for etching the lift-off material to expose the substrate surface or expose the oxide film on the substrate surface in a wiring pattern form.

Step (d): A wiring conductor of Al, Cu or Au is laid on the entire surface of the substrate by vapor deposition or sputtering. It is desirable to remove the mask for etching the lift-off material in advance, but the mask for dry etching, such as a $SiO_2$ film, if present, may stay as it is.

Step (e): The lift-off material is dissolved in the etching solution by dipping and removed, whereby the wiring conductor material on the surface of the lift-off material is also removed. Only the wiring conductor is formed in the desired pattern on the substrate.

Polyimide-based resin so far widely used in the lift-off technique has the following unit structural formula X.

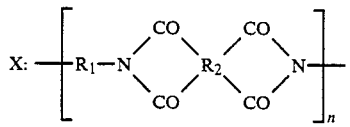

wherein $R_1$:

$R_2$:

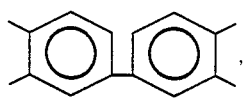

and n is an integer of 15,000 to 30,000.

The difference between the resin having the unit structural formula Y and that having the unit structural formula X is in the structure of $R_2$.

Polyimide-based resin having the unit structural formula Y is a novel resin, and the present invention is characterized by forming a wiring by using this novel resin as a lift-off material according to the lift-off technique.

The wiring on a substrate is not limited to a single layer, but to a multiple layer, i.e. two or more layers.

In forming a wiring in a multiple layer on a substrate, it is desirable to form a wiring by laying polyimide-based resin having the unit structural formula Y on a polyimide-based resin having the unit structural formula X in the following manner. That is, a polyimide-based resin having the unit structural formula X is applied to a substrate as an underlayer, and then a polyimide-based resin having the unit structural formula Y is applied to the surface of the underlayer. It is desirable that the layer thickness of polyimide-based resin having the unit structural formula X is made approximately equal to the thickness of one wiring layer. For example, in the case of forming one wiring layer having a thickness of 10 to 20 μm, the polyimide-based resin having the unit structural formula X must have a thickness of 10 to 20 μm.

After the polyimide-based resin having the unit structural formula X and that having the unit structural formula Y are successively formed on the substrate, a mask for etching a lift-off material, for example, a $SiO_2$ mask for dry etching, is formed to a thickness of about 1 μm on the polyimide-based resin having the unit structural formula Y by sputtering, or the like, and dry etching is carried out with $O_2$ plasma or an Ar gas containing $O_2$ with the aid of the mask, whereby the lift-off material composed of the polyimide-based resin having the unit structural formula Y and the lift-off material composed of the polyimide-based resin having the unit structural formula X are patterned in a wiring pattern form. When the polyimide-based resin having the unit structural formula X has a layer thickness of more than 10 μm, dry etching is preferable because wet etching is hard to carry out. Then, a wiring conductor of Al, Cu, Au or the like is vapor deposited or sputtered thereon. Successively, the polyimide-based resin having the unit structural formula Y and the wiring conductor material formed on the polyimide-based resin having the unit structural formula Y are removed with an etching solution. There is a difference in the etching rate between the polyimide-based resin having the unit structural formula, X and that having the unit structural formula Y. The polyimide-based resin having the unit structural formula X takes a few hours to etch, whereas the polyimide-based resin having the unit structural formula Y takes a few ten minutes to etch. Thus, by dipping the entire substrate having the polyimide-based resin having the unit structural formula X and that having the unit structural formula Y in the etching solution for a few ten minutes, and taking it from the etching solution, only the polyimide-based resin having the unit structural formula Y and the wiring conductor formed thereon can be lifted off.

After formation of the first wiring layer in this manner, the polyimide-based resin having the unit structural formula X is laid again thereon as an underlayer, and that having the unit structural formula Y is laid thereon as an upper layer to form the lift-off materials. By repeating the same steps as above, a pedestal for connecting the first wiring layer to a second wiring layer is formed. The second wiring layer is further formed in the same manner as in the formation of the first wiring layer. Successively, a third wiring layer and a fourth wiring layer can be likewise formed.

Thus, by lifting off only the polyimide-based resin having the unit structural formula Y while leaving the polyimide-based resin having the unit structural formula X without lifting off, and by making the layer thickness of the polyimide-based resin having the unit structural formula X approximately equal to the thickness of wiring, the surface of the lift-off material can be flattened when the second and further wiring layers are formed. By flattening the surface of the lift-off material, the etching rate becomes substantially uniform throughout the entire surface of the lift-off material, and patterning can be made in a desired wiring pattern form. The polyimide-based resin having the unit structural formula X and that having the unit structural formula Y as applied to a substrate are in a varnish state, and thus are desirably hardened by heating after the application to the substrate. Heat hardening is necessary not only for forming one wiring layer, but also for forming two or more wiring layers. The heating temperature for heat hardening both polyimide-based resins having the unit structural formulae X and Y is desirably about 350° C.

The etching solution for lifting off the polyimide-based resin having the unit structural formula Y is a mixture of hydrazine and ethylenediamine preferably containing a hydrazine content of 30 to 70% by mole.

In the process for forming a wiring according to the present invention, substantially equal effects can be obtained, even if $R_1$ in the unit structural formula Y is any of the following groups (I), (II) and (III).

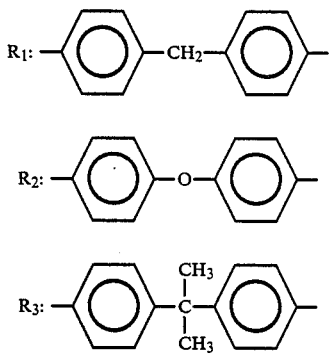

It is also possible to use the following $R_2$ group in the unit structural formula Y.

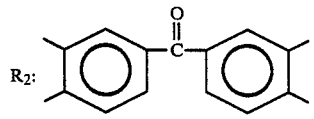

The polyimide-based resin having the unit structural formula Y having the said $R_2$ group has an etching rate intermediate between that of the polyimide-based resin having the unit structural formula X and that of the polyimide-based resin having the unit structural formula Y described above.

BRIEF DESCRIPTION OF THE DRAWINGS

FIGS. 1(A) to (G) are schematic views showing steps according to one embodiment of the present invention.

PREFERRED EMBODIMENT OF THE INVENTION

One embodiment of the present invention will be described below, but the present invention is not limited thereto.

EXAMPLE 1

This embodiment shows preparation of a substrate with a multiple wiring layer e.g. two wiring layers for LSI module.

Figure 3:
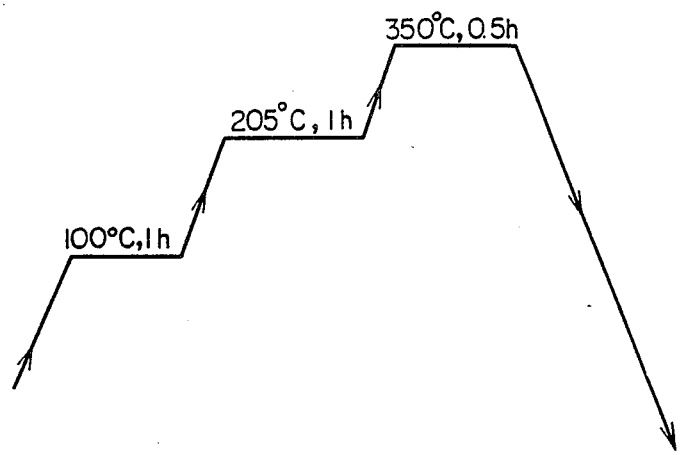
FIG. 3 is a graph showing a heat pattern for heat treating a lift-off material.

As shown in FIG. 1, a lower lift-off film 2 composed of polyimide-based resin having the following unit structural formula X is applied to a thickness of 10 μm to a Si substrate 1 and hardened by heat treatment in vacuum according to the heat pattern shown in FIG. 3.

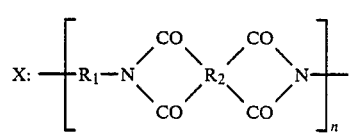

wherein $R_1$:

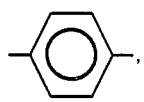

$R_2$:

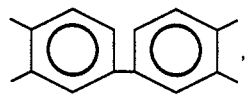

and n is an integer of 15,000 to 30,000.

Further, an upper lift-off film 3 composed of polyimide-based resin having the following unit structural formula Y is applied to a thickness of 3 μm to the surface of the lower lift-off film 2, and likewise hardened by heat treatment according to the heat pattern shown in FIG. 3.

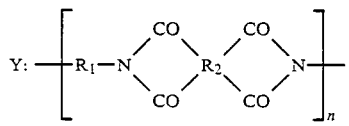

wherein $R_1$:

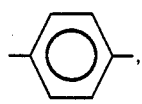

$R_2$:

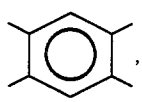

and n is an integer of 15,000 to 30,000.

Then, masks 4 composed of SiO$_2$ are formed to a thickness of about 1 μm on the upper lift-off film 3 by sputtering and patterning is carried out with a photoresist [FIG. 1(A)].

The photoresist is removed, and then the lower lift-off film 2 and the upper lift-off film 3 are dry etched with O$_2$ plasma to form a wiring pattern [FIG. 1(B)].

Then, wiring conductors 5 composed of Cu are vapor deposited to a thickness of 10 μm at a substrate temperature of 200° C. [FIG. 1(C)].

Then, the substrate 1 is dipped in an etching solution composed of hydrazine and ethylenediamine at a mixing ratio of 1:1 by mole for 30 minutes to remove the upper lift-off film 3 by lifting off [FIG. 1(D)]. In this manner, the first wiring layer is formed.

Then, a lower lift-off film 2a composed of the polyimide based resin having the unit structural formula X is formed on the lower lift-off film 2 and the first layer of wiring conductor 5, and then an upper lift-off film 3a composed of the polyimide-based resin having the unit structural formula Y and then a mask 4a for dry etching are formed thereon in the same manner as in FIG. 1(A). Then, dry etching is carried out with O$_2$ plasma and the lift-off films 2a and 3a are patterned to form a through-hole 6 for connecting the first layer of wiring conductor 5 to a second layer of wiring conductor to be successively formed [FIG. 1(E)].

The Cu is vapor deposited onto the entire surface, as was shown in FIG. 1(C), and then the entire substrate is dipped in the same etching solution as above to remove the lift-off film 3a and the Cu deposited thereon. In this manner, a pedestal 7 for connection is formed [FIG. 1(F)].

Then, in the same manner as in FIGS. 1(A) and (B), a lower lift-off film 2b composed of polyimide-based resin having the unit structural formula X is formed on the lower lift-off film 2a composed of the polyimide-based resin having the unit structural formula X, and then an upper lift-off film 3b composed of polyimide-based resin having the unit structural formula Y and a mask 4b for dry etching, composed of a SiO$_2$ sputtered mask, are formed thereon successively. Then, the upper and lower lift-off films are patterned according to the wiring pattern of the second layer [FIG. 1(G)].

Then, a wiring conductor composed of Cu for a second layer is vapor deposited, and the upper lift-off film 3b is removed (lifted off) by the etching solution, whereby a second wiring layer is formed.

Figure 2:
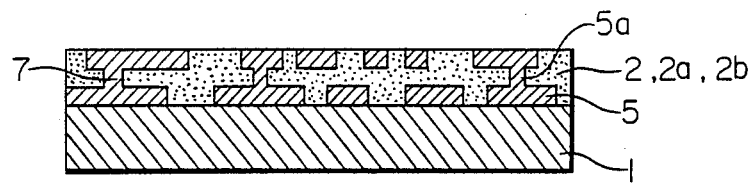
FIG. 2 is a cross-sectional view of a multiple wiring layer obtained according to the embodiment shown in FIG. 1.

FIG. 2 is a cross-sectional view of finally formed wiring. When the second layer of wiring film 5a is formed, the second layer of lift-off film can be flattened by leaving the lower lift-off film used for forming the first layer of wiring and making the thickness of the lower lift-off film equal to that of the first layer of wiring. Thus, the etching of lift-off film proceeds uniformly throughout the entire surface and a desired wiring pattern can be patterned.

Figure 5A:
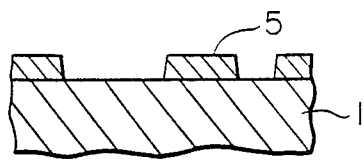
FIGS. 5(A) and (B) are schematic views showing one example of lifting off the lower lift-off film in forming a multiple wiring layer.
Figure 5B:
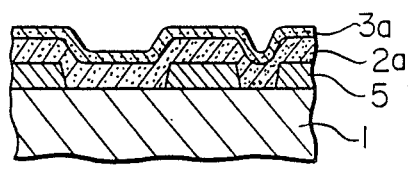

FIG. 5(A) shows the state where the first layer of lower lift-off film 2 is removed, and FIG. 5(B) shows the state where a lower lift-off film 2a and an upper lift-off film 3a are formed from the state of FIG. 5(A). It can be seen therefrom that the lift-off films 2a and 3a cannot be flattened.

EXAMPLE 2

In this Example, an embodiment of forming only one layer of wiring conductor is given.

Figure 6A:
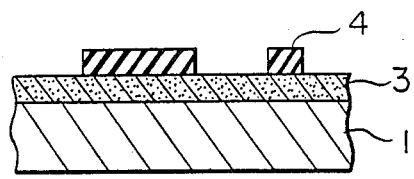
FIGS. 6(A) to (D) are schematic views showing steps according to another embodiment of the present invention.
Figure 6B:
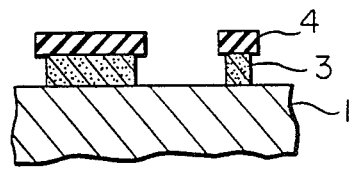

As shown in FIG. 6(A), a lift-off film 3 composed of polyimide-based resin having the unit structural formula Y is applied to a thickness of 15 μm to a Si substrate 1, and hardened by heat treatment according to the heat pattern of FIG. 3. Then, SiO$_2$ sputtered films 4 are formed thereon.

The lift-off film 3 is patterned by dry etching with O$_2$ plasma [FIG. 7(B)]. The patterning may be a wet etching with an etching solution.

Figure 6C:
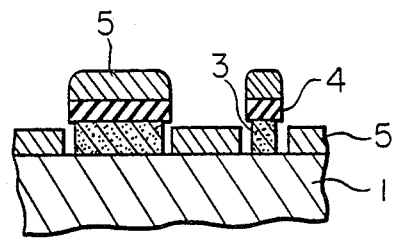

Then, wiring conductors 5 composed of Cu are vapor deposited to a thickness of 15 μm after the SiO$_2$ mask 4 has been removed or while retaining the SiO$_2$ mask 4 [FIG. 6(C)].

Figure 6D:
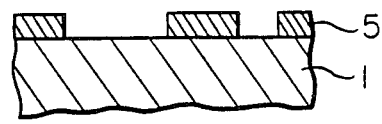

Then, the lift-off film 3 and the wiring conductors 5 thereon are lifted off with an etching solution [FIG. 6(D)].

In the foregoing steps, formation of the lift-off film 3, patterning of the lift-off film and lifting off of the lift-off film are carried out in the same manner as in Example 1. It is possible to use Al, Au, or the like as the wiring conductor material besides Cu.

In this manner, it is possible to lift off a wiring film as thick as 10–20 μm by etching when polyimide-based resin having the unit structural formula Y is used as the lift-off film.

COMPARATIVE EXAMPLE

FIG. 4 shows a process for forming a wiring with polyimide-based resin having the unit structural formula X as a lift-off material.

Figure 4A:
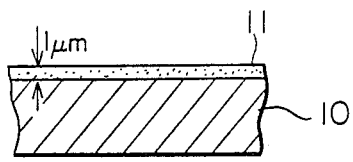
FIGS. 4(A) to (E) are schematic views showing a conventional process for forming a wiring.

A lift-off film 11 composed of polyimide-based resin having the unit structural formula X as a lift-off material is formed on a Si substrate 10 [FIG. 4(A)].

Figure 4B:
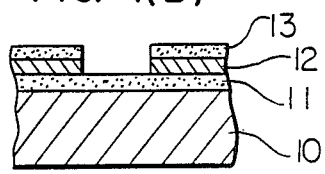

The lift-off film 11 is hardened by heat treatment according to the heat pattern of FIG. 3 and masks 12 composed of Cr and resists 13 are laid successively thereon to make masking [FIG. 4(B)].

Figure 4C:
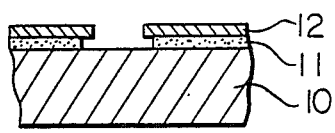

Furthermore, a wiring pattern is formed on the substrate 10 by dry etching with O$_2$ plasma [FIG. 4(C)].

Figure 4D:
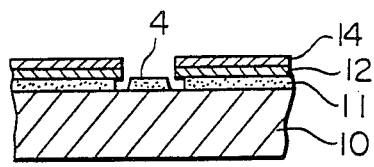
Figure 4E:
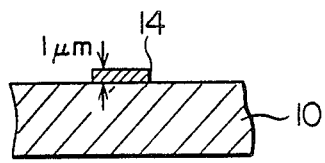

Wiring conductors 14 composed of Cu or Al are vapor deposited thereon [FIG. 4(D)].

Then, the lift-off film 11 is removed (lifted off) by O$_2$ plasma usher treatment, while leaving only conductor 14 as a wiring on the substrate 10.

In the wiring formation, lifting off must be carried out by dry etching because of poor wet etching susceptibility of polyimide-based resin having the unit structural formula X, and also there remain residues of the lift-off film. Furthermore, it is impossible to form a wiring film as thick as 10–20 μm.

As described above, a wiring film as thick as 10–20 μm can be readily lifted off with an etching solution when polyimide-based resin having the unit structural formula Y is used. By using polyimide-based resin having the unit structural formula X as a lower lift-off film and polyimide-based resin having the unit structural formula Y as an upper lift-off film and by lifting off only the upper lift-off film, lift-off films can be flattened in the multiple layer wiring and the wiring pattern precision can be enhanced.

What is claimed is:

1. A process for forming a wiring on a substrate which comprises a step of forming a lower lift-off film composed of polyimide-based resin having the unit structural formula X on a wiring substrate and then forming an upper lift-off film composed of polyimide-based resin having the following unit structural formula Y, a step of forming a mask for etching a desired pattern on the upper lift-off film, a step of patterning the upper lift-off film and the lower lift-off film along the pattern of the mask for etching, thereby exposing the surface of the substrate, a step of forming a wiring conductor material on the exposed surface of the substrate and the upper lift-off film by sputtering or vapor deposition and a step of lifting off the upper lift-off film from the lower lift-off film with an etching solution of a mixture of hydrazine and ethylene diamine:

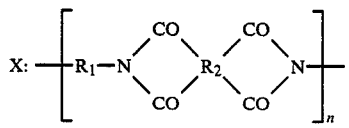

wherein $R_1$:

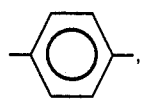

$R_2$:

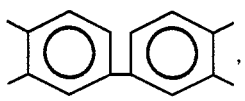

n is an integer of 15,000 to 30,000, and

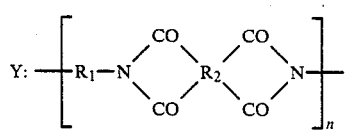

wherein $R_1$:

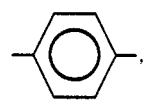

$R_2$:

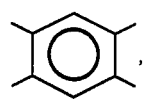

n is an integer of 15,000 to 30,000.

2. A process according to claim 1, wherein a mask for dry etching is formed on the upper lift-off film, and the upper lift-off film and the lower lift-off film are patterned by dry etching.

3. A process according to claim 2, wherein a $SiO_2$ sputtered mask is formed as the mask for dry etching.

4. A process according to claim 1, wherein the wiring conductor is formed to a thickness equal or substantially equal to the thickness of the lower lift-off film by sputtering or vapor deposition.

5. A process according to claim 1, wherein the etching solution for the upper lift-off film is a mixture of hydrazine and ethylenediamine having a hydrazine content of 30 to 70% by mole.

6. A process for forming a multiple layer wiring on a substrate, which comprises forming a first wiring layer according to a step of forming a first lower lift-off film composed of polyimide-based resin having the following unit structural formula X on a wiring substrate, a step of forming a first upper lift-off film composed of polyamide-based resin having the following unit structural formula Y on the first lower lift-off film, a step of forming a first mask for etching in a desired pattern on the first upper lift-off film, a step of patterning the first upper lift-off film and the first lower lift-off film along the pattern of the first mask for etching, thereby exposing the surface of the substrate, a step of forming a wiring conductor material for a first wiring layer to a thickness equal or substantially equal to that of the first lower lift-off film on the exposed surface of the substrate and the first upper lift-off film by sputtering or vapor deposition, and a step of lifting off the first upper lift-off film from the first lower lift-off film with an etching solution of a mixture of hydrazine and ethylene diamine; forming a pedestal for connecting the first wiring layer to a second wiring layer according to a step of forming a second lower lift-off film having the unit structural formula X on the first wiring layer and the first lower lift-off film, a step of forming a second upper lift-off film having the unit structural formula Y on the second lower lift-off film, a step of forming a second mask for etching in a desired pattern on the second upper lift-off film, a step of patterning the second upper lift-off film and the second lower lift-off film along the pattern of the second mask for etching, thereby forming a throughole for connecting the first wiring layer to second wiring layer to be successively formed, a step of vapor deposition or sputtering a wiring conductor material on the throughole and the second upper lift-off film, and a step of lifting off the second upper lift-off film with an etching solution of a mixture of hydraxine and ethylene diamine; and forming a second wiring layer according to a step of forming a third lower lift-off film composed of polyamide-based resin having the unit structural formula X on the pedestal and the second lower lift-off film, a step of forming a third upper lift-off film composed of polyimide-based resin having the unit structural formula Y on the third lower lift-off film, a step of forming a third mask for etching in a desired pattern on the third upper lift-off film, a step of patterning the third upper lift-off film and the third lower lift-off film along the pattern of the third mask for etching, thereby exposing the pedestal for connection, a step of forming a wiring conductor material for a second wiring layer on the pedestal and the third upper lift-off film by sputtering or vapor deposition, and a step of lifting off the third upper lift-off film from the third lower lift-off film with an etching solution of a mixture of hydrazine and ethylene diamine:

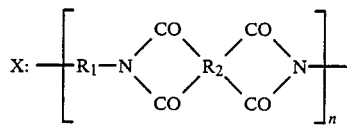

wherein $R_1$:

$R_2$:

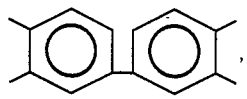

n is an integer of 15,000 to 30,000, and

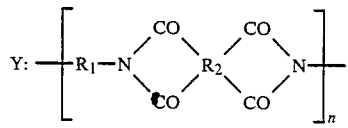

wherein $R_1$:

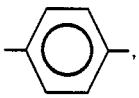

$R_2$:

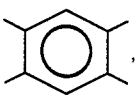

n is an integer of 15,000 to 30,000.

7. A process according to claim 6, wherein the etching solution is a mixture of hydrazine and ethyline-diamine having a hydrazine content of 30 to 70% by mole.

8. A process according to claim 6, wherein all of the masks for etching are masks for dry etching, and after formation of the masks, the upper lift-off films and the lower lift-films are patterned by dry etching.

9. A process according to claim 8, wherein $SiO_2$ sputtered films are used as the masks for dry etching.

10. A process according to claim 8, wherein the dry etching $O_2$ plasma etching.

11. A process for forming a wiring on a substrate, which comprises: a step of applying polyimide-based resin having the following unit structural formula X to a thickness of 10 to 20 μm to a wiring substrate, then hardening the resin by heating, thereby forming a lower lift-off film, further applying polyamide-based resin having the following unit structural formula Y thereto, and hardening the resin by heating, thereby forming an upper lift-off film, and step of forming a mast for etching in a desired pattern on the upper lift-off film, a step of patterning the upper lift-off film and the lower lift-off film along the pattern of the mask for etching, thereby exposing the surface of the substrate, a step of forming a wiring conductor material to a thickness of 10 to 20 μm on the exposed surface of the substrate and the upper lift-off film by sputtering or vapor deposition, and a step of lifting off the upper lift-off film from the lower lift-off film with an etching solution of a mixture of hydrazine and ethylene diamine:

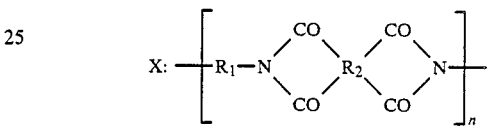

wherein $R_1$:

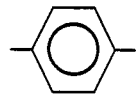

$R_2$:

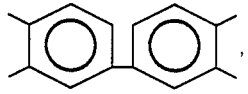

n is an integer of 15,000 to 30,000, and

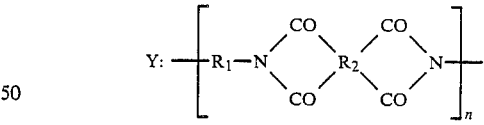

wherein $R_1$:

$R_2$

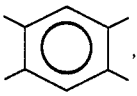

n is an integer of 15,000 to 30,000.

* * * * *